(12) United States Patent
Lou et al.

(10) Patent No.: US 11,754,619 B2
(45) Date of Patent: Sep. 12, 2023

(54) PROBING APPARATUS WITH TEMPERATURE-ADJUSTING MECHANISM

(71) Applicant: STAR TECHNOLOGIES, INC., Hsinchu (TW)

(72) Inventors: Choon Leong Lou, Hsinchu (TW); Chen-Wen Pan, Hsinchu (TW); Jung-Chieh Liu, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 118 days.

(21) Appl. No.: 17/145,738

(22) Filed: Jan. 11, 2021

(65) Prior Publication Data
US 2022/0221508 A1 Jul. 14, 2022

(51) Int. Cl.
*G01R 31/28* (2006.01)
*H01L 21/67* (2006.01)

(52) U.S. Cl.
CPC .... *G01R 31/2874* (2013.01); *H01L 21/67109* (2013.01); *H01L 21/67248* (2013.01)

(58) Field of Classification Search
CPC .......... G01R 31/2874; H01L 21/67109; H01L 21/67248
See application file for complete search history.

(56) References Cited

U.S. PATENT DOCUMENTS

| | | | | |
|---|---|---|---|---|
| 7,332,918 B2* | 2/2008 | Sugiyama | .......... | G01R 31/2865 324/750.19 |
| 8,035,405 B2* | 10/2011 | Lou | .......... | G01R 31/2874 324/750.08 |
| 2011/0295539 A1* | 12/2011 | Tsai | .......... | H01L 21/67248 702/135 |
| 2015/0309112 A1* | 10/2015 | Goh | .......... | G01R 31/2874 324/750.08 |
| 2017/0010306 A1* | 1/2017 | Na | .......... | G01R 31/2875 |
| 2020/0225266 A1* | 7/2020 | Lou | .......... | G01R 31/2891 |

FOREIGN PATENT DOCUMENTS

| | | | |
|---|---|---|---|
| JP | 11145218 | 5/1999 | |
| JP | 2000241454 | 9/2000 | |
| JP | 2006108456 A * | 4/2006 | ............. G01R 31/26 |

(Continued)

OTHER PUBLICATIONS

An Office Action in corresponding JP Application No. 2021116368 dated Sep. 5, 2022 is attached, 4 pages with an English translation.

*Primary Examiner* — Alvaro E Fortich
*Assistant Examiner* — Dilara Sultana
(74) *Attorney, Agent, or Firm* — MUNCY, GEISSLER, OLDS & LOWE, P.C.

(57) ABSTRACT

The present disclosure provides a probing apparatus for semiconductor devices using pressurized fluid to control the testing conditions. The probing apparatus includes a housing configured to define a testing chamber; a device holder positioned on the housing and configured to hold and support at least one device under test; a platen positioned on the housing and configured to retain at least one probe; a card holder positioned on the platen and configured to hold a probe card including the probe; and at least one flow line positioned in the card holder. The flow line is configured to flow a fluid therein to adjust the temperature of the device under test.

22 Claims, 7 Drawing Sheets

(56) References Cited

FOREIGN PATENT DOCUMENTS

| | | | | |
|---|---|---|---|---|
| JP | 2008051792 | 3/2008 | | |
| JP | 2008053624 | 3/2008 | | |
| JP | 2010062523 | 3/2010 | | |
| JP | 2015035577 | 2/2015 | | |
| JP | 2016099300 | 5/2016 | | |
| JP | 2018160591 | 10/2018 | | |
| KR | 20180009090 A | * 1/2018 | ............. | G01R 31/28 |

* cited by examiner

PROBING APPARATUS WITH TEMPERATURE-ADJUSTING MECHANISM

TECHNICAL FIELD

The present disclosure relates to a probing apparatus for semiconductor devices, and more particularly, to a probing apparatus for semiconductor devices using pressurized fluid to control the testing conditions.

DISCUSSION OF THE BACKGROUND

Generally, it is necessary to test the electrical characteristics of integrated circuit devices at the wafer level to check whether the integrated circuit device satisfies the product specification. Integrated circuit devices with electrical characteristics satisfying the specification are selected for the subsequent packaging process, and the other devices are discarded to avoid additional packaging cost. Test time and cost are much increased with the increasing test requirements and conditions especially increasing temperature ranges. Therefore, a testing device that enables the optimal adjustment of the testing temperature of the integrated circuit device under test remains urgently needed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a probing apparatus, comprising: a housing configured to define a testing chamber; a device holder positioned on the housing and configured to hold and support at least one device under test; a platen positioned on the housing and configured to retain at least one probe; a card holder positioned on the platen and configured to hold a probe card including the probe; and at least one flow line positioned in the card holder, wherein the flow line is configured to flow a fluid therein to adjust the temperature of the device under test.

In some embodiments, the probing apparatus further comprises a temperature controller configured to control the temperature of the device under test at a predetermined temperature.

In some embodiments, the temperature controller comprises a heater and/or a cooler.

In some embodiments, the probing apparatus further comprises a transfer conduit coupling the temperature controller to the flow line positioned in the card holder.

In some embodiments, the temperature controller controls the temperature of the fluid according to a temperature prober so the temperature of device under test maintains at the predetermined temperature.

In some embodiments, the temperature controller controls the temperature of the fluid according to an infrared temperature sensor so the temperature of device under test maintains at the predetermined temperature.

In some embodiments, the temperature controller controls the temperature of the fluid according to a preset configuration so the temperature of the device under test maintains at the predetermined temperature.

In some embodiments, the card holder is integrated with the probe card.

In some embodiments, the card holder comprises a plurality of plates, and the flow line is formed by the plates of the card holder.

In some embodiments, the flow line includes at least one inlet and one outlet, and the fluid is a gas, a liquid, or a mixture thereof.

In some embodiments, the device holder further comprises a transparent cover.

Another aspect of the present disclosure provides a probing apparatus, comprising: a housing configured to define a testing chamber; a device holder positioned on the housing and configured to hold and support at least one device under test; a platen positioned on the housing and configured to retain at least one probe; a card holder positioned on the platen and configured to hold a probe card including the probes; and at least one flow line positioned in the card holder, wherein a first flow line is configured to flow a first fluid therein to adjust the temperature of the device under test, and a second flow line is configured to flow a second fluid therein to adjust the temperature of the probe card.

In some embodiments, the probing apparatus further comprises a temperature controller configured to control the temperature of the device under test at a first predetermined temperature and to control the temperature of the probe card at a second predetermined temperature.

In some embodiments, the temperature controller comprises a heater and/or a cooler.

In some embodiments, the probing apparatus further comprises a transfer conduit coupling the temperature controller to the flow lines positioned in the card holder.

In some embodiments, the temperature controller controls the temperature of the first fluid and the second fluid according to a temperature prober so the temperature of device under test maintains at the first predetermined temperature, and the temperature of the probe card maintains at the second predetermined temperature.

In some embodiments, the temperature controller controls the temperature of the first fluid and the second fluid according to an infrared temperature sensor so the temperature of device under test maintains at the first predetermined temperature, and the temperature of the probe card maintains at the second predetermined temperature.

In some embodiments, the temperature controller controls the temperature of the first fluid and the second fluid according to a preset configuration so the temperature of the device under test maintains at the predetermined temperature, and the temperature of the probe card maintains at the second predetermined temperature.

In some embodiments, the card holder comprises a plurality of plates, and the flow lines are formed by the plates of the card holder.

In some embodiments, the flow lines include at least one inlet and one outlet, and the first fluid and the second fluid are respectively a gas, a liquid, or a mixture thereof.

In some embodiments, the device holder further comprises a transparent cover.

Accordingly, the probing apparatuses in embodiments of the present disclosure introduce the fluid in the flow lines positioned in the card holder to control the temperature variation of the device under test within a predetermined acceptable range. The flow lines can maintain the temperature uniformity of the device under test even if the movable three-axes stage moves the device under test at a certain temperature to any region of the testing chamber. Therefore, to adjust the temperature of the device under test with the fluid in the flow lines, the probing apparatuses of the present disclosure are capable of providing a proper testing environment for the device under test at the predetermined temperature.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
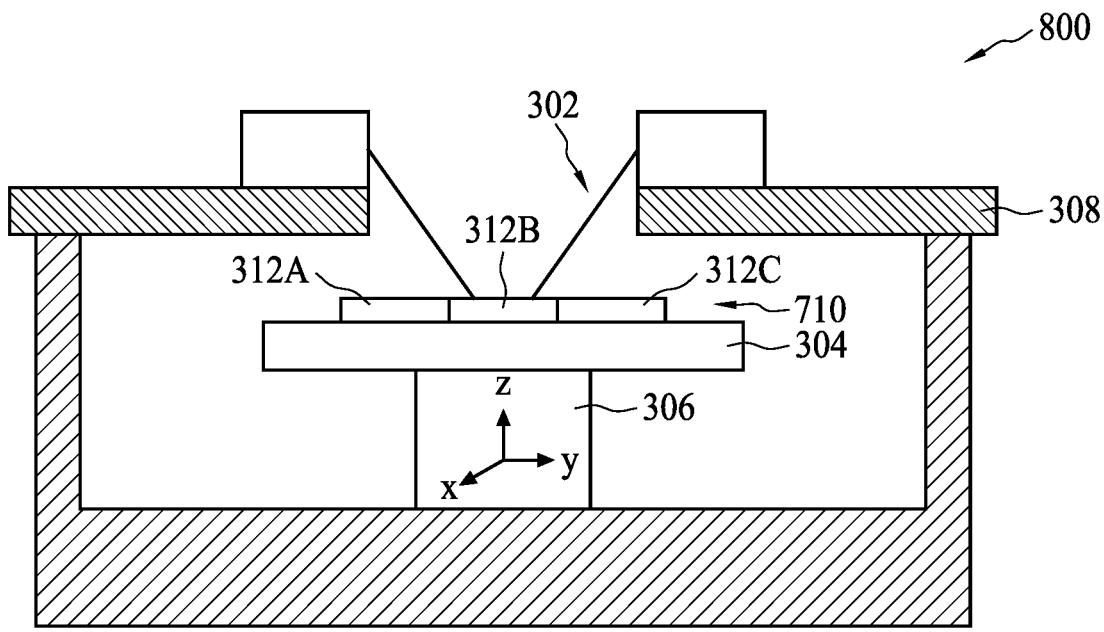
FIG. 1 depicts a conventional probe system using a probe card or probes for contacting a wafer on a temperature-controlling unit.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

The present disclosure is directed to a probing apparatus comprising temperature control mechanisms with flow lines. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 2:
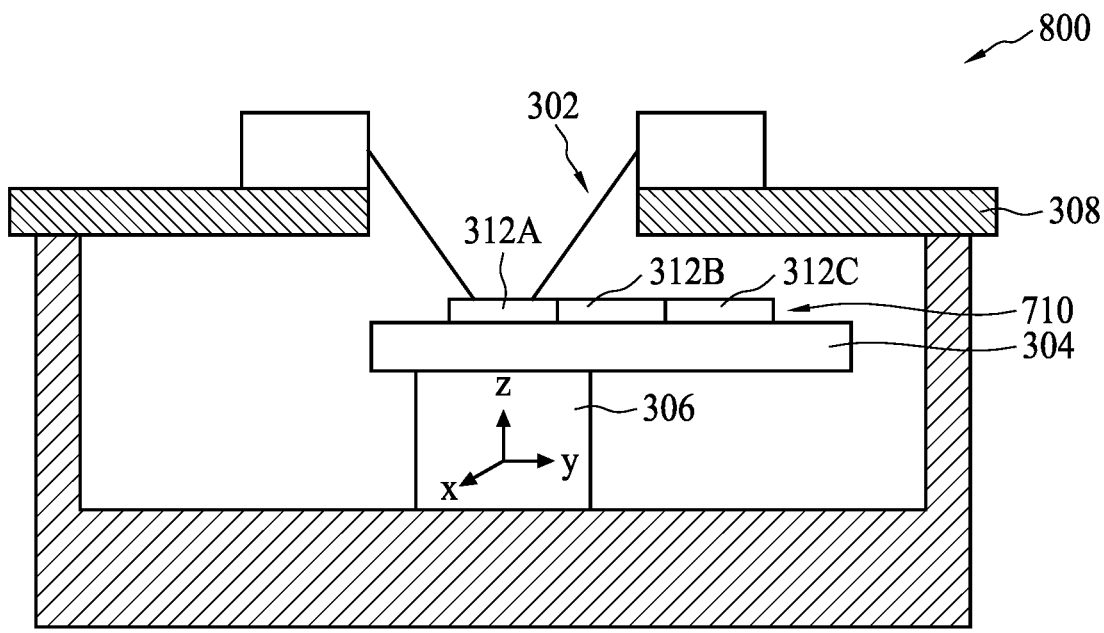
FIG. 2 depicts a conventional probe system using a probe card or probes for contacting a wafer on a temperature-controlling unit.

FIG. 1 and FIG. 2 depict a conventional probe system 800 using a probe card or probes 302 for contacting a wafer 710 on a temperature-controlling unit 304. The temperature-controlling unit 304 holding the wafer 710 with a plurality of devices 312A-312C under test can move in the X, Y and Z axes by using a three-axes stage 306. The time to stable probe contact will increase with changing temperature of the temperature-controlling unit 304 or the movement of the temperature-controlling unit 304. Change of temperature of the temperature-controlling unit 304 will require the adjoining parts such as the platen 308 and a probe card or probes 302 to expand or contract and stabilize with the changing temperature. On the other hand, with the movement of the temperature-controlling unit 304 as shown in FIG. 2, the proximity of the adjoining parts will change and thus requiring it to be stabilized before contacting to the wafer 710.

Figure 3:
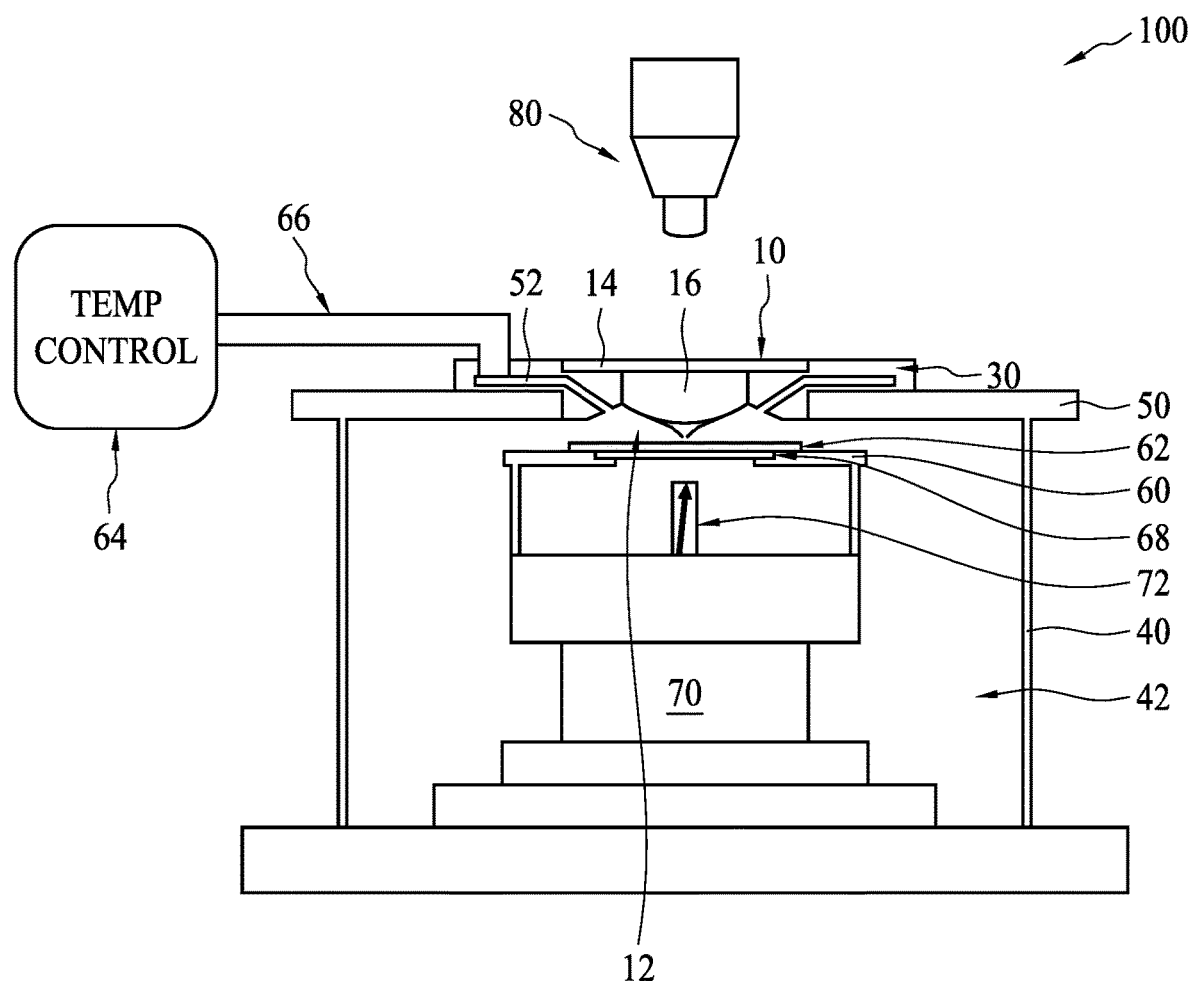
FIG. 3 is a cross sectional view of a probing apparatus in accordance with some embodiments of the present disclosure.

FIG. 3 is a cross sectional view of a probing apparatus 100 in accordance with some embodiments of the present disclosure. With reference to FIG. 3, the probing apparatus 100 includes a housing 40, a device holder 60, a movable three-axes stage 70 positioned on the housing 40, a platen 50, a card holder 30, and at least one flow line 52 positioned in the card holder 30. In some embodiments, the housing 40 is configured to define a testing chamber 42. The device holder 60, which may be a chuck, is positioned on the housing 40 and is configured to hold and support at least one device under test 62. In some embodiments, the at least one device under test 62 may be semiconductor devices such as integrated circuit devices. In some embodiments, the platen 50 is positioned on the housing 40 and configured to retain at least one probe 12. The card holder 30 is positioned on the platen 50 and configured to hold a probe card 10 including the probes 12. In some embodiments, the probe card 10 further includes a circuit board 14 and a supporter 16 positioned on the circuit board 14, and the probes 12 are positioned on the supporter 16. In some embodiments, the probes 12 are fixed on the supporter 16 by epoxy resin or other types of adhesive.

In some embodiments, the flow line 52 is configured to flow a fluid therein to adjust the temperature of the device under test 62. In some embodiments, the probing apparatus 100 further includes a temperature controller 64 configured to control the temperature of the device under test 62 at a predetermined temperature. In some embodiments, the probing apparatus 100 may further include an image-capturing device 80 configured to capture an alignment image of the device under test 62 and the probes 12, such that an operator can adjust the position of the probes 12 by use of a hydraulic stage (not shown). The image-capturing device 80 may be a charge-coupled device (CCD) camera, although embodiments of the disclosure are not limited thereto.

With reference to FIG. 3, in some embodiments, the temperature controller 64 may include a heater and/or a cooler. The temperature controller 64 may also include a cooler, and the cooler may include a heat exchanger chiller. In some embodiments, the temperature controller 64 may include an air compressor in the cooler (not shown). In some embodiments, the probing apparatus 100 may further include a transfer conduit 66 coupling the temperature controller 64 to the flow line 52 positioned in the card holder 30. In some embodiments, the temperature controller 64 controls the temperature of the fluid according to a temperature prober so the temperature of the device under test 62 maintains at the predetermined temperature. In some embodiments, the temperature prober may be positioned in the testing chamber 42 at a suitable location so as to capture the temperature of the device under test 62. In some embodiments, the temperature prober may be placed at the device holder 60 or at the card holder 30. In some embodiments, the temperature controller 64 controls the temperature of the fluid according to an infrared temperature sensor so the temperature of device under test 62 maintains at the predetermined temperature. In some embodiments, the infrared temperature sensor may be positioned in the testing chamber 42 at a suitable location so as to capture the temperature of the device under test 62. In some embodiments, the temperature prober may be placed at the device holder 60 or at the card holder 30. In some embodiments, the temperature controller 64 controls the temperature of the fluid according to a preset configuration so the temperature of the device under test 62 maintains at the predetermined temperature. In some embodiments, the preset configuration may be stored in a memory in the temperature controller 64. The preset configuration may include, a range of acceptable temperature differences between the temperature of the device under test 62 and the temperature of the testing chamber 42. In other embodiments, the preset configuration may also be retrieved from an external memory or accessed via a communication network by the temperature controller 64.

In some embodiments, the device holder 60 further includes a transparent cover 68. The transparent cover 68 may be made of glass, ceramic, plastic, other suitable materials, or mixture thereof. In some embodiments, the probing apparatus 100 may also include a light source 72 configured to project a light through the transparent cover 68 towards the device under test 62, such that the image-capturing device 80 can capture the alignment image of the device under test 62 and the probes 12.

Figure 4:
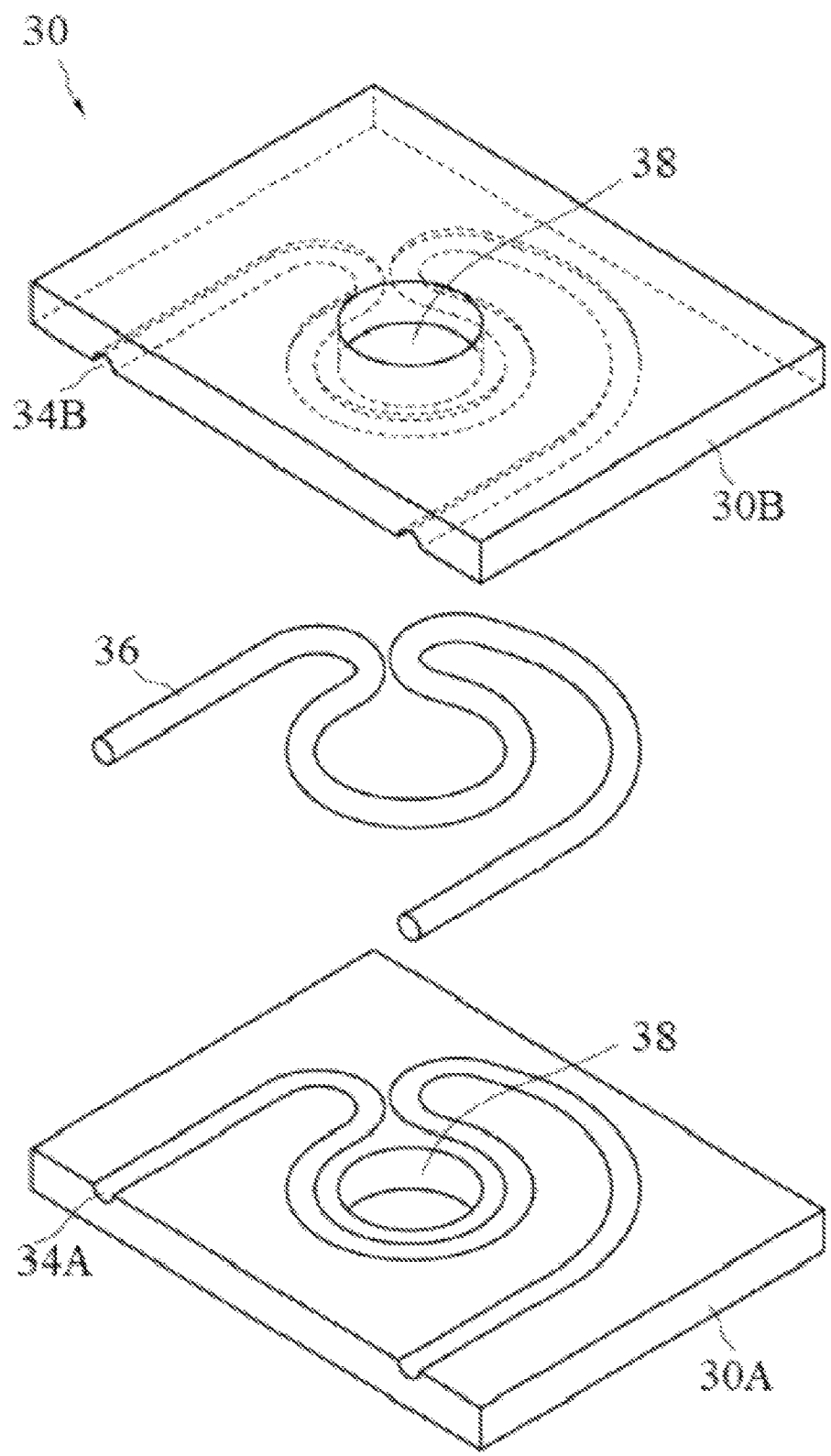
FIG. 4 is a perspective view of the flow line positioned in a card holder of a probing apparatus in accordance with some embodiments of the present disclosure.

FIG. 4 is a perspective view of the flow line 52 positioned in the card holder 30 of the probing apparatus 100 in accordance with some embodiments of the present disclosure. With reference to FIG. 4, in some embodiments, the card holder 30 includes a bottom plate 30A and an upper plate 30B, and the flow line 52 is formed by the bottom plate 30A and the upper plate 30B. The bottom plate 30A is positioned on the platen 50 and has a bottom groove 34A. The upper plate 30B is positioned on the bottom plate 30A and has an upper groove 34B. In some embodiments, the shape and position of the bottom groove 34A correspond to those of the upper groove 34B, and a guiding tube 36 may be positioned in the bottom groove 34A and the upper groove 34B. The card holder 30 includes an opening 38, and the probes 12 of the probe card 10 contacts a pad of the device under test 62 through the opening 38. In some embodiments, the bottom groove 34A, the upper groove 34B, and the guiding tube 36 form the flow line 52 around the opening 38.

In some embodiments, the flow line 52 includes at least one inlet and one outlet, and the fluid may be a gas, a liquid, or a mixture thereof. Moreover, the card holder 30 may include a plurality of plates, and the flow line 52 is formed by the plates and positioned on one of the plates. It should be noted that, although FIG. 4 shows that the flow line 52 includes one guiding tube 36, it should be appreciated by those skilled in the art that, in other embodiments, the flow line 52 may also include several guiding tubes 36 with a variety of other possible pattern designs. The probing apparatus 100 in embodiments of the present disclosure introduces the fluid in the flow line 52 positioned in the card holder 30 to control the temperature variation of the device under test 62 within a predetermined acceptable range. Accordingly, the flow line 52 can maintain the temperature uniformity of the device under test 62, even if the movable three-axes stage 70 moves the device under test 62 at a certain temperature to any region of the testing chamber 42. Therefore, to adjust the temperature of the device under test 62 with the fluid in the flow line 52, the probing apparatus 100 is capable of providing a proper testing environment for the device under test 62 at the predetermined temperature.

Figure 5:
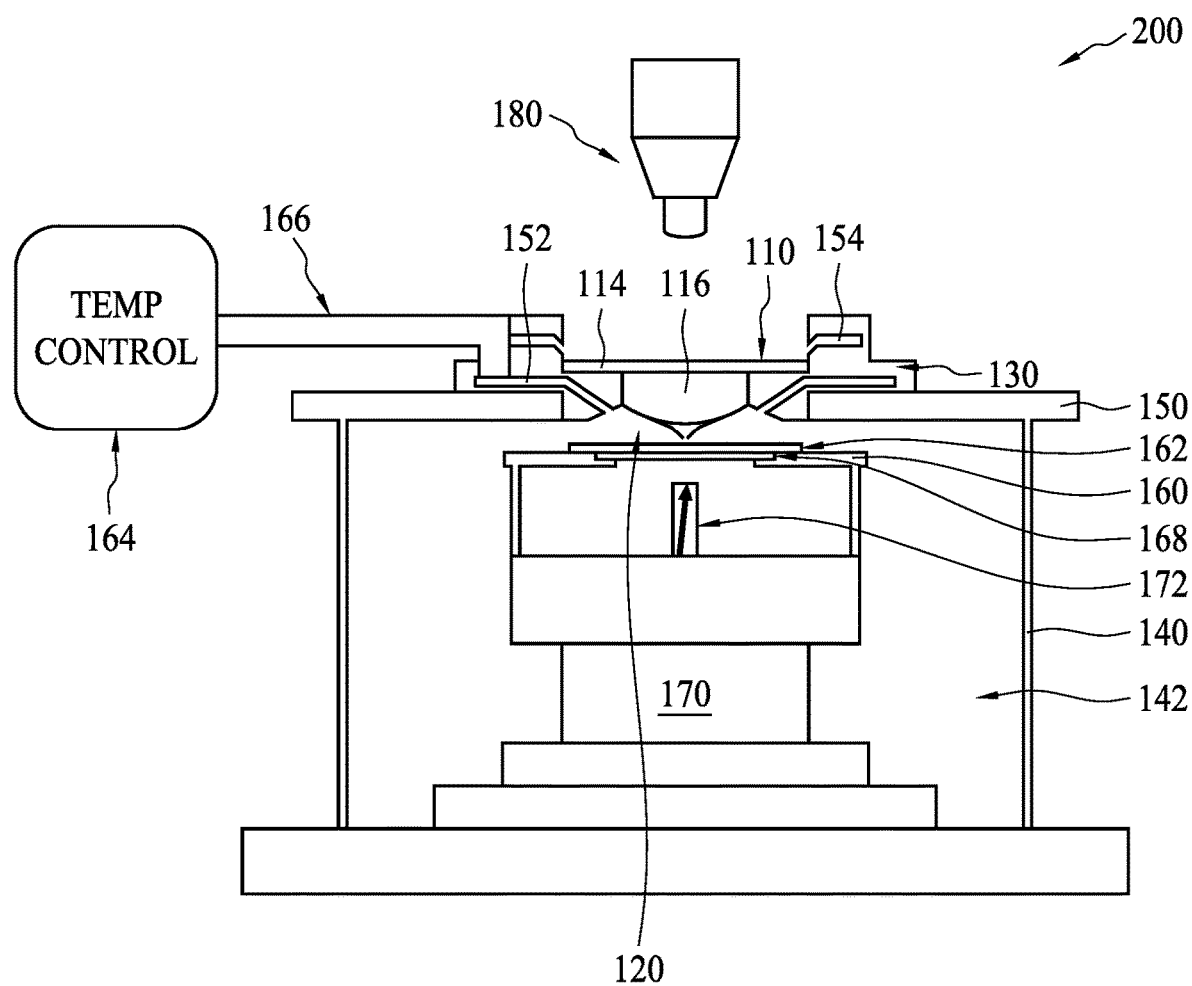
FIG. 5 is a cross sectional view of a probing apparatus in accordance with some embodiments of the present disclosure.

FIG. 5 is a cross sectional view of a probing apparatus 200 in accordance with some embodiments of the present disclosure. With reference to FIG. 5, the probing apparatus 200 includes a housing 140, a device holder 160, a movable three-axes stage 170 positioned on the housing 140, a platen 150, a card holder 130, and a first flow line 152 and a second flow line 154 positioned in the card holder 130. In some embodiments, the housing 140 is configured to define a testing chamber 142. The device holder 160, which may be a chuck, is positioned on the housing 140 and is configured to hold and support at least one device under test 162. In some embodiments, the at least one device under test 162 may be semiconductor devices such as integrated circuit devices. In some embodiments, the platen 150 is positioned on the housing 140 and configured to retain at least one probe 120. The card holder 130 is positioned on the platen 150 and configured to hold a probe card 110 including the probes 120. In some embodiments, the probe card 110 further includes a circuit board 114 and a supporter 116 positioned on the circuit board 114, and the probes 120 are positioned on the supporter 116. In some embodiments, the probes 120 are fixed on the supporter 116 by epoxy resin or other types of adhesive.

In some embodiments, at least one flow line is positioned in the card holder 130. A first flow line 152 is configured to flow a first fluid therein to adjust the temperature of the device under test 162. A second flow line 154 is configured to flow a second fluid therein to adjust the temperature of the probe card 110. In some embodiments, the probing apparatus 200 further includes a temperature controller 164 configured to control the temperature of the device under test 162 at a first predetermined temperature and to control the temperature of the probe card 110 at a second predetermined temperature. In some embodiments, the probing apparatus 200 may further include an image-capturing device 180 configured to capture an alignment image of the device under test 162 and the probes 120, such that an operator can adjust the position of the probes 120 by use of a hydraulic stage (not shown). The image-capturing device 180 may be a CCD camera, although embodiments of the disclosure are not limited thereto.

With reference to FIG. 5, in some embodiments, the temperature controller 164 may include a heater and/or a cooler. The temperature controller 164 may also include a cooler, and the cooler may include a heat exchanger chiller. In some embodiments, the temperature controller 164 may include an air compressor in the cooler (not shown). In some embodiments, the probing apparatus 200 may further include a transfer conduit 166 coupling the temperature controller 164 to the first flow line 152 and the second flow line 154 positioned in the card holder 30. In some embodiments, the temperature controller 164 controls the temperature of the first fluid and the second fluid according to a temperature prober so the temperature of the device under test 162 maintains at the first predetermined temperature, and the temperature of the probe card 110 maintains at the second predetermined temperature. In some embodiments, the temperature prober may be positioned in the testing chamber 142 at a suitable location so as to capture the temperature of the device under test 162 and the probe card 110. In some embodiments, the temperature prober may be placed at the device holder 160 or at the card holder 130. In some embodiments, the temperature controller 164 controls the temperature of the first fluid and the second fluid according to an infrared temperature sensor so the temperature of device under test 162 maintains at the first predetermined temperature, and the temperature of the probe card 110 maintains at the second predetermined temperature. In some embodiments, the infrared temperature sensor may be positioned in the testing chamber 142 at a suitable location so as to capture the temperature of the device under test 162 and the probe card 110. In some embodiments, the temperature prober may be placed at the device holder 160 or at the card holder 130. In some embodiments, the temperature controller 164 controls the temperature of the first fluid and the second fluid according to a preset configuration so the temperature of the device under test 162 maintains at the first predetermined temperature, and the temperature of the probe card 110 maintains at the second predetermined temperature. In some embodiments, the preset configuration may be stored in a memory in the temperature controller 164. The preset configuration may include, a range of acceptable temperature differences between the temperature of the device under test 162 and the temperature of the testing chamber 142, and the acceptable temperature differences between the temperature of the probe card 110 and the temperature of the testing chamber 142. In other embodiments, the preset configuration may also be retrieved from an external memory or accessed via a communication network by the temperature controller 164.

In some embodiments, the device holder 160 further includes a transparent cover 168. The transparent cover 168 may be made of glass, ceramic, plastic, other suitable materials, or mixture thereof. In some embodiments, the probing apparatus 200 may also include a light source 172 configured to project a light through the transparent cover 168 towards the device under test 162, such that the image-capturing device 180 can capture the alignment image of the device under test 162 and the probes 120.

In some embodiments, the first flow line 152 and the second flow line 154 include at least one inlet and one outlet, and the first fluid and the second fluid may be a gas, a liquid, or a mixture thereof, respectively. Moreover, the card holder 130 may include a plurality of plates, and the first flow line 152 and the second flow line 154 are formed by the plates and respectively positioned on the plates. The probing apparatus 200 in embodiments of the present disclosure introduces the first fluid and the second fluid in the flow lines 152 and 154 positioned in the card holder 30 to control the temperature variations of the device under test 162 and the probe card 110 within predetermined acceptable ranges. Accordingly, the flow lines 152 and 154 can maintain the temperature uniformity of the device under test 162 and the probe card 110, even if the movable three-axes stage 170 moves the device under test 162 at a certain temperature to any region of the testing chamber 142. Therefore, to adjust the temperature of the device under test 162 and the probe card 110 with the fluids in the flow lines 152 and 154, the probing apparatus 200 is capable of providing a proper testing environment for the device under test 162 at the predetermined temperature.

Figure 6:
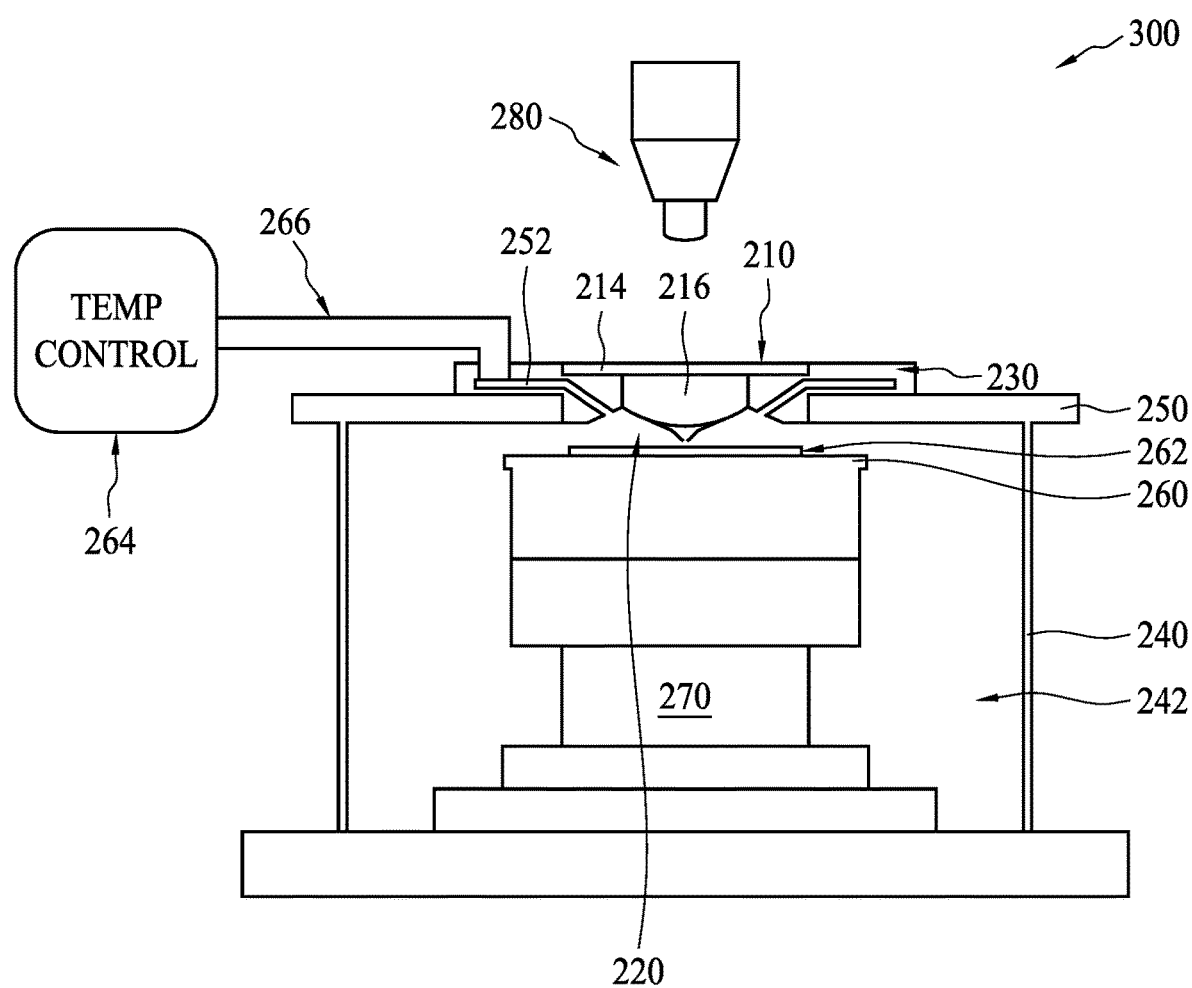
FIG. 6 is a cross sectional view of a probing apparatus in accordance with some embodiments of the present disclosure.

FIG. 6 is a cross sectional view of a probing apparatus 300 in accordance with some embodiments of the present disclosure. A difference between the probing apparatus 300 of FIG. 6 and the probing apparatus 100 of FIG. 3 is that, a device holder 260 of the probing apparatus 300 is nontransparent, whereas the device holder 60 of the probing apparatus 100 has a transparent cover 68. With reference to FIG. 6, the probing apparatus 300 includes a housing 240, the device holder 260, a movable three-axes stage 270 positioned on the housing 240, a platen 250, a card holder 230, and at least one flow line 252 positioned in the card holder 230. In some embodiments, the housing 240 is configured to define a testing chamber 242. The device holder 260, which may be a chuck, is positioned on the housing 240 and is configured to hold and support at least one device under test 262. In some embodiments, the at least one device under test 262 may be semiconductor devices such as integrated circuit devices. In some embodiments, the platen 250 is positioned on the housing 240 and configured to retain at least one probe 220. The card holder 230 is positioned on the platen 250 and configured to hold a probe card 210 including the probes 220. In some embodiments, the probe card 210 further includes a circuit board 214 and a supporter 216 positioned on the circuit board 214, and the probes 220 are positioned on the supporter 216. In some embodiments, the probes 220 are fixed on the supporter 216 by epoxy resin or other types of adhesive.

In some embodiments, the flow line 252 is configured to flow a fluid therein to adjust the temperature of the device under test 262. In some embodiments, the probing apparatus 300 further includes a temperature controller 264 configured to control the temperature of the device under test 262 at a predetermined temperature. In some embodiments, the probing apparatus 300 may further include an image-capturing device 280 configured to capture an alignment image of the device under test 262 and the probes 220, such that an operator can adjust the position of the probes 220 by use of a hydraulic stage (not shown). The image-capturing device 280 may be a CCD camera, although embodiments of the disclosure are not limited thereto.

With reference to FIG. 6, in some embodiments, the temperature controller 264 may include a heater and/or a cooler. The temperature controller 264 may also include a cooler, and the cooler may include a heat exchanger chiller. In some embodiments, the temperature controller 264 may include an air compressor in the cooler (not shown). In some embodiments, the probing apparatus 300 may further include a transfer conduit 266 coupling the temperature controller 264 to the flow line 252 positioned in the card holder 230. In some embodiments, the temperature controller 264 controls the temperature of the fluid according to a temperature prober so the temperature of the device under test 262 maintains at the predetermined temperature. In some embodiments, the temperature prober may be positioned in the testing chamber 242 at a suitable location so as to capture the temperature of the device under test 262. In some embodiments, the temperature prober may be placed at the device holder 260 or at the card holder 230. In some embodiments, the temperature controller 264 controls the temperature of the fluid according to an infrared temperature sensor so the temperature of device under test 262 maintains at the predetermined temperature. In some embodiments, the infrared temperature sensor may be positioned in the testing chamber 242 at a suitable location so as to capture the temperature of the device under test 262. In some embodiments, the temperature prober may be placed at the device holder 260 or at the card holder 230. In some embodiments, the temperature controller 264 controls the temperature of the fluid according to a preset configuration so the temperature of the device under test 262 maintains at the predetermined temperature. In some embodiments, the preset configuration may be stored in a memory in the temperature controller 264. The preset configuration may include, a range of acceptable temperature differences between the temperature of the device under test 262 and the temperature of the testing chamber 242. In other embodiments, the preset configuration may also be retrieved from an external memory or accessed via a communication network by the temperature controller 264.

In some embodiments, the flow line 252 includes at least one inlet and one outlet, and the fluid may be a gas, a liquid, or a mixture thereof. Moreover, the card holder 230 may include a plurality of plates, and the flow line 252 is formed by the plates and positioned on one of the plates. The probing apparatus 300 in embodiments of the present disclosure introduces the fluid in the flow line 252 positioned in the card holder 230 to control the temperature variation of the device under test 262 within a predetermined acceptable range. Accordingly, the flow line 252 can maintain the temperature uniformity of the device under test 62, even if the movable three-axes stage 270 moves the device under test 262 at a certain temperature to any region of the testing chamber 242. Therefore, to adjust the temperature of the device under test 262 with the fluid in the flow line 252, the probing apparatus 300 is capable of providing a proper testing environment for the device under test 262 at the predetermined temperature.

Figure 7:
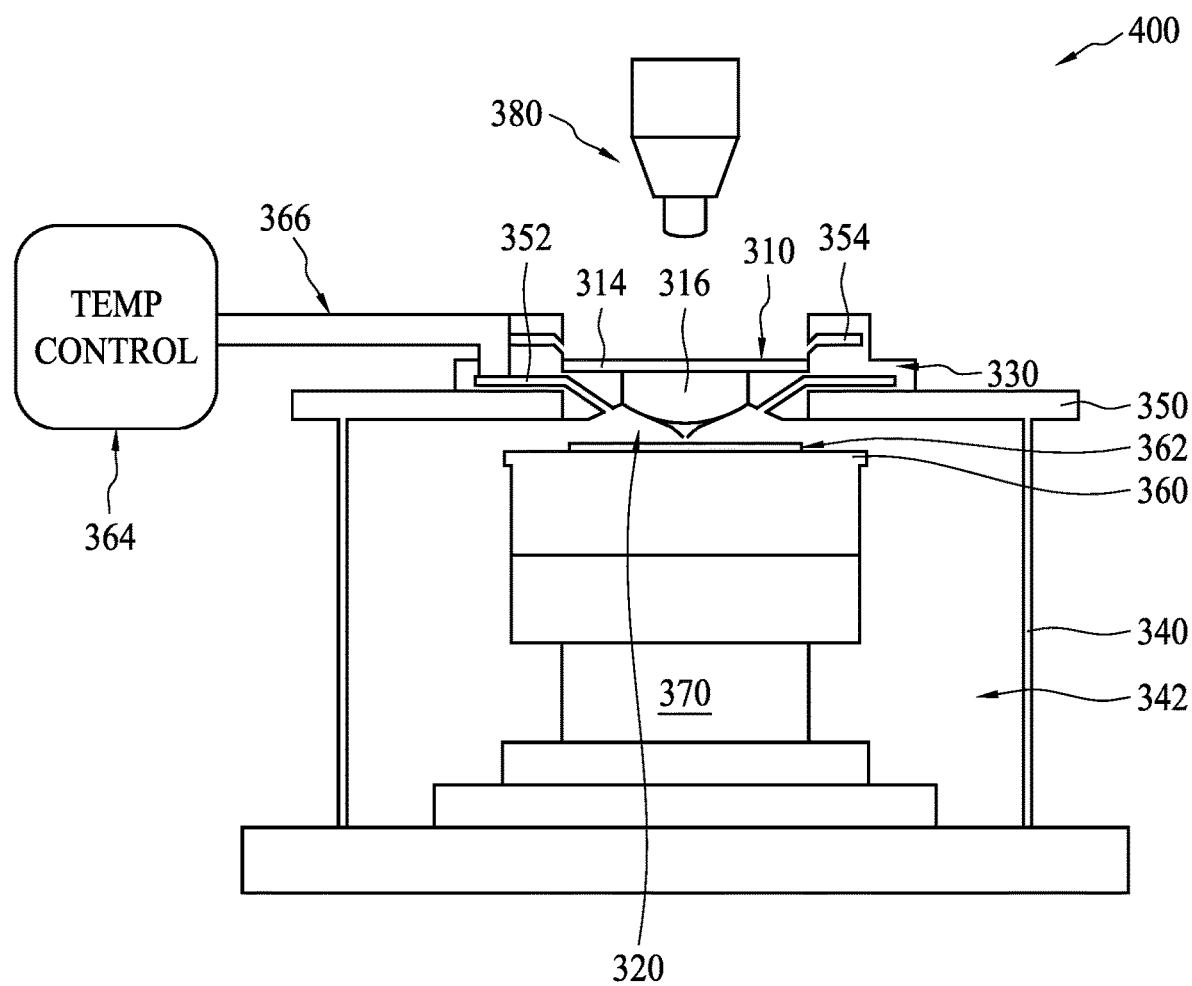
FIG. 7 is a cross sectional view of a probing apparatus in accordance with some embodiments of the present disclosure.

FIG. 7 is a cross sectional view of a probing apparatus 400 in accordance with some embodiments of the present disclosure. A difference between the probing apparatus 400 of FIG. 7 and the probing apparatus 200 of FIG. 5 is that, a device holder 360 of the probing apparatus 400 is nontransparent, whereas the device holder 160 of the probing apparatus 200 has a transparent cover 168. With reference to FIG. 7, the probing apparatus 400 includes a housing 340, the device holder 360, a movable three-axes stage 370 positioned on the housing 340, a platen 350, a card holder 330, and a first flow line 352 and a second flow line 354 positioned in the card holder 330. In some embodiments, the housing 340 is configured to define a testing chamber 342. The device holder 360, which may be a chuck, is positioned on the housing 340 and is configured to hold and support at least one device under test 362. In some embodiments, the at least one device under test 362 may be semiconductor devices such as integrated circuit devices. In some embodiments, the platen 350 is positioned on the housing 340 and configured to retain at least one probe 320. The card holder 330 is positioned on the platen 350 and configured to hold a probe card 310 including the probes 320. In some embodiments, the probe card 310 further includes a circuit board 314 and a supporter 316 positioned on the circuit board 314, and the probes 320 are positioned on the supporter 316. In some embodiments, the probes 320 are fixed on the supporter 316 by epoxy resin or other types of adhesive.

In some embodiments, at least one flow line is positioned in the card holder 330. A first flow line 352 is configured to flow a first fluid therein to adjust the temperature of the device under test 362. A second flow line 354 is configured to flow a second fluid therein to adjust the temperature of the probe card 310. In some embodiments, the probing apparatus 400 further includes a temperature controller 364 configured to control the temperature of the device under test 362 at a first predetermined temperature and to control the temperature of the probe card 310 at a second predetermined temperature. In some embodiments, the probing apparatus 400 may further include an image-capturing device 380 configured to capture an alignment image of the device under test 362 and the probes 320, such that an operator can adjust the position of the probes 320 by use of a hydraulic stage (not shown). The image-capturing device 380 may be a CCD camera, although embodiments of the disclosure are not limited thereto.

With reference to FIG. 7, in some embodiments, the temperature controller 364 may include a heater and/or a cooler. The temperature controller 364 may also include a cooler, and the cooler may include a heat exchanger chiller. In some embodiments, the temperature controller 364 may include an air compressor in the cooler (not shown). In some embodiments, the probing apparatus 400 may further include a transfer conduit 366 coupling the temperature controller 364 to the first flow line 352 and the second flow line 354 positioned in the card holder 330. In some embodiments, the temperature controller 364 controls the temperature of the first fluid and the second fluid according to a temperature prober so the temperature of the device under test 362 maintains at the first predetermined temperature, and the temperature of the probe card 310 maintains at the second predetermined temperature. In some embodiments, the temperature prober may be positioned in the testing chamber 342 at a suitable location so as to capture the temperature of the device under test 362 and the probe card 310. In some embodiments, the temperature prober may be placed at the device holder 360 or at the card holder 330. In some embodiments, the temperature controller 364 controls the temperature of the first fluid and the second fluid according to an infrared temperature sensor so the temperature of device under test 362 maintains at the first predetermined temperature, and the temperature of the probe card 310 maintains at the second predetermined temperature. In some embodiments, the infrared temperature sensor may be positioned in the testing chamber 342 at a suitable location so as to capture the temperature of the device under test 362 and the probe card 310. In some embodiments, the temperature prober may be placed at the device holder 360 or at the card holder 330. In some embodiments, the temperature controller 364 controls the temperature of the first fluid and the second fluid according to a preset configuration so the temperature of the device under test 362 maintains at the first predetermined temperature, and the temperature of the probe card 310 maintains at the second predetermined temperature. In some embodiments, the preset configuration may be stored in a memory in the temperature controller 364. The preset configuration may include, a range of acceptable temperature differences between the temperature of the device under test 362 and the temperature of the testing chamber 342, and the acceptable temperature differences between the temperature of the probe card 310 and the temperature of the testing chamber 342. In other embodiments, the preset configuration may also be retrieved from an external memory or accessed via a communication network by the temperature controller 364.

In some embodiments, the first flow line 352 and the second flow line 354 include at least one inlet and one outlet, and the first fluid and the second fluid may be a gas, a liquid, or a mixture thereof, respectively. Moreover, the card holder 330 may include a plurality of plates, and the first flow line 352 and the second flow line 354 are formed by the plates and respectively positioned on the plates. The probing apparatus 400 in embodiments of the present disclosure introduces the first fluid and the second fluid in the flow lines 352 and 354 positioned in the card holder 330 to control the temperature variations of the device under test 362 and the probe card 310 within predetermined acceptable ranges. Accordingly, the flow lines 352 and 354 can maintain the temperature uniformity of the device under test 362 and the probe card 310, even if the movable three-axes stage 370 moves the device under test 362 at a certain temperature to any region of the testing chamber 342. Therefore, to adjust the temperature of the device under test 362 and the probe card 310 with the fluids in the flow lines 352 and 354, the probing apparatus 400 is capable of providing a proper testing environment for the device under test 362 at the predetermined temperature.

Figure 8:
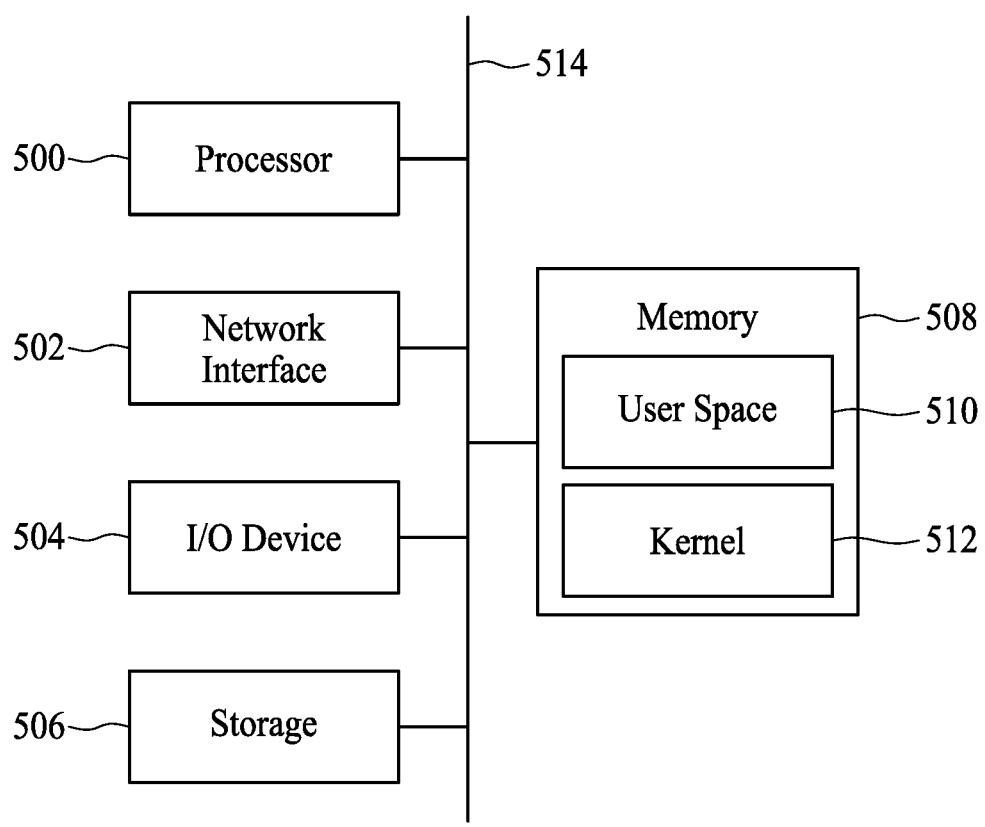
FIG. 8 is a block diagram of a computer system according to some embodiments of the present disclosure.

It should be noted that, one or more of the temperature controllers 64, 164, 264, and 364 described in the present disclosure may further include a computer system including instructions operable when executed by one or more processors of the computer system to perform temperature control for the probing apparatuses 100, 200, 300, and 400. FIG. 8 is a block diagram of a computer system 1000 according to some embodiments of the present disclosure. With reference to FIG. 8, the computer system 1000 may include one or more processors 500, a network interface (I/F) 502, a storage device 506, a memory 508, and an input/output (I/O) device 504 communicatively coupled via a bus 514 or other interconnection communication mechanism. The memory 508 includes, in some embodiments, a random access memory (RAM), other dynamic storage device, read-only memory (ROM), or other static storage device, coupled to the bus 514 for storing data or instructions to be executed by the one or more processors 500, and the memory 508 may include a kernel 512, a user space 510, portions of the kernel or the user space, and components thereof. The memory 508 is also used, in some embodiments, for storing temporary variables or other intermediate information during execution of instructions to be executed by the one or more processors 500.

In some embodiments, the storage device 506 is coupled to the bus 514 for transferring data or instructions to, the kernel 512, user space 510, etc. In some embodiments, the operations and functionalities are realized as functions of a program stored in the storage device 506, which may include one or more computer-readable non-transitory storage media coupled to the one or more processors 500. Examples of the computer-readable non-transitory storage media include, but are not limited to, external/removable or internal/built-in storage or memory unit, e.g., one or more of an optical disk, such as a DVD, a magnetic disk, a hard disk, a semiconductor memory, a memory card, and the like. In some embodiments, the I/O device 504 includes an input device, an output device, or a combined input/output device for enabling user interaction with the probing apparatuses 100, 200, 300, and 400. An input device includes, a keyboard, keypad, mouse, trackball, trackpad, or cursor direction keys for communicating information and commands to the processor 500. An output device includes, a display, a printer, a voice synthesizer, etc. for communicating information to a user. In some embodiments, one or more operations or functionalities of the tools, subsystems, and methods described in the present disclosure are realized by the one or more processors 500 of the computer system 1000, which is programmed for performing such operations and functionalities. One or more of the memory 508, the network I/F 502, the storage device 506, the I/O device 504, and the bus 514 are operable to hold and support instructions, data, design rules, netlists, layouts, models and other parameters for processing by the processor 500. In some embodiments, one or more of the operations and functionalities of the tools and subsystems described in the present disclosure may be implemented by specifically configured hardware (e.g., by one or more application specific integrated circuits (ASICs)) separate from or in lieu of the processor 500. Some embodiments incorporate more than one of the described operations or functionality in a single ASIC.

Accordingly, the probing apparatuses in embodiments of the present disclosure introduce the fluid in the flow lines positioned in the card holder to control the temperature variation of the device under test within a predetermined acceptable range. The flow lines can maintain the temperature uniformity of the device under test even if the movable three-axes stage moves the device under test at a certain temperature to any region of the testing chamber. Therefore, to adjust the temperature of the device under test with the fluid in the flow lines, the probing apparatuses of the present disclosure are capable of providing a proper testing environment for the device under test at the predetermined temperature.

One aspect of the present disclosure provides a probing apparatus, comprising: a housing configured to define a testing chamber; a device holder positioned on the housing and configured to hold and support at least one device under test; a platen positioned on the housing and configured to retain at least one probe; a card holder positioned on the platen and configured to hold a probe card including the probe; and at least one flow line positioned in the card holder, wherein the flow line is configured to flow a fluid therein to adjust the temperature of the device under test.

Another aspect of the present disclosure provides a probing apparatus, comprising: a housing configured to define a testing chamber; a device holder positioned on the housing and configured to hold and support at least one device under test; a platen positioned on the housing and configured to retain at least one probe; a card holder positioned on the platen and configured to hold a probe card including the probes; and at least one flow line positioned in the card holder, wherein a first flow line is configured to flow a first fluid therein to adjust the temperature of the device under test, and a second flow line is configured to flow a second fluid therein to adjust the temperature of the probe card.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A probing apparatus, comprising:
    a housing configured to define a testing chamber;
    a device holder positioned in the housing and configured to hold and support at least one device under test;
    a platen positioned on the housing;
    a probe card comprising at least one probe;
    a card holder positioned on the platen and configured to hold the probe card; and
    at least one flow line positioned in the card holder, wherein the flow line is configured to flow a fluid into the testing chamber to control a temperature variation of the device under test within a predetermined acceptable range,
    wherein the flow line comprises at least one inlet and at least one outlet, the inlet is outside the testing chamber and the outlet is inside the testing chamber.

2. The probing apparatus of claim 1, further comprising:
    a temperature controller configured to control the temperature of the device under test at a predetermined temperature.

3. The probing apparatus of claim 2, wherein the temperature controller comprises a heater and/or a cooler.

4. The probing apparatus of claim 2, further comprising:
    a transfer conduit coupling the temperature controller to the flow line positioned in the card holder.

5. The probing apparatus of claim 4, wherein the temperature controller controls the temperature of the fluid according to a temperature prober so the temperature of device under test maintains at the predetermined temperature.

6. The probing apparatus of claim 4, wherein the temperature controller controls the temperature of the fluid according to an infrared temperature sensor so the temperature of device under test maintains at the predetermined temperature.

7. The probing apparatus of claim 4, wherein the temperature controller controls the temperature of the fluid according to a preset configuration so the temperature of the device under test maintains at the predetermined temperature.

8. The probing apparatus of claim 1, wherein the card holder comprises a plurality of plates, and the flow line is formed by the plates of the card holder.

9. The probing apparatus of claim 1, wherein the card holder is integrated with the probe card.

10. The probing apparatus of claim 1, wherein the fluid is a gas, a liquid, or a mixture thereof.

11. The probing apparatus of claim 1, wherein the device holder further comprises a transparent cover.

12. A probing apparatus, comprising:
    a housing configured to define a testing chamber;
    a device holder positioned in the housing and configured to hold and support at least one device under test;
    a platen positioned on the housing;
    a probe card comprising at least one probe;
    a card holder positioned on the platen and configured to hold the probe card;
    a first flow line positioned in the card holder and configured to flow a first fluid into the testing chamber to adjust the temperature of the test chamber, wherein the first flow line comprises a first inlet and a first outlet, the first inlet is outside the testing chamber, and the first outlet is inside the testing chamber; and
    a second flow line is configured to flow a second fluid in the card holder to adjust the temperature of the probe card, wherein the second flow line comprises a second inlet and a second outlet, and the second inlet and the second outlet are outside the testing chamber.

13. The probing apparatus of claim 12, further comprising:
    a temperature controller configured to control the temperature of the device under test at a first predetermined temperature and to control the temperature of the probe card at a second predetermined temperature.

14. The probing apparatus of claim 13, wherein the temperature controller comprises a heater and/or a cooler.

15. The probing apparatus of claim 13, further comprising:
    a transfer conduit coupling the temperature controller to the flow lines positioned in the card holder.

16. The probing apparatus of claim 15, wherein the temperature controller controls the temperature of the first fluid and the second fluid according to a temperature prober so the temperature of device under test maintains at the first predetermined temperature, and the temperature of the probe card maintains at the second predetermined temperature.

17. The probing apparatus of claim 15, wherein the temperature controller controls the temperature of the first fluid and the second fluid according to an infrared temperature sensor so the temperature of device under test maintains at the first predetermined temperature, and the temperature of the probe card maintains at the second predetermined temperature.

18. The probing apparatus of claim 15, wherein the temperature controller controls the temperature of the first fluid and the second fluid according to a preset configuration so the temperature of the device under test maintains at the predetermined temperature, and the temperature of the probe card maintains at the second predetermined temperature.

19. The probing apparatus of claim 12, wherein the card holder comprises a plurality of plates, and the flow lines are formed by the plates of the card holder.

20. The probing apparatus of claim 12, wherein the first fluid and the second fluid are respectively a gas, a liquid, or a mixture thereof.

21. The probing apparatus of claim 12, wherein the device holder further comprises a transparent cover.

22. The probing apparatus of claim 12, wherein the card holder is integrated with the probe card.

\* \* \* \* \*